United States Patent [19]

Tarbox

[11] Patent Number: 4,483,373
[45] Date of Patent: Nov. 20, 1984

[54] UNIVERSAL WIRING HARNESS FORMBOARD

[76] Inventor: John W. Tarbox, 13096 Caminito Del Rocio, Del Mar, Calif. 92014

[21] Appl. No.: 470,275

[22] Filed: Feb. 28, 1983

[51] Int. Cl.$^3$ .............................................. B21F 21/00
[52] U.S. Cl. ..................................... 140/92.1; 29/739
[58] Field of Search ............... 140/93 R, 92.1; 29/739

[56] References Cited

U.S. PATENT DOCUMENTS

| | | | |
|---|---|---|---|
| 3,346,020 | 10/1967 | Geisinger | 140/92.1 |
| 3,653,411 | 4/1972 | Mosher et al. | 140/92.1 |
| 3,752,198 | 8/1973 | Fiorentino et al. | 140/92.1 |

Primary Examiner—Lowell A. Larson
Assistant Examiner—Jorji M. Griffin
Attorney, Agent, or Firm—Ralph S. Branscomb

[57] ABSTRACT

A harness wiring universal formboard of modular construction utilizes modules which define a grid of forming pin stations each of which has a pin which is selectably retracted or in the extended mode for use in the wiring harness pattern. The single board can be used with any pattern, and the particular pin pattern desired is achieved by applying a pattern sheet across the front of the board with holes punched at the locations where the pins in the desired pin pattern should be, and then with the pattern in place rotating the board upside down so that gravity pulls the pins through holes in the formboard at those locations permitted by the pattern achieved. The extended pins are then locked into place and the module or modules righted to the appropriate angle and height most convenient for the harness maker.

19 Claims, 15 Drawing Figures

U.S. Patent  Nov. 20, 1984  Sheet 2 of 2  4,483,373
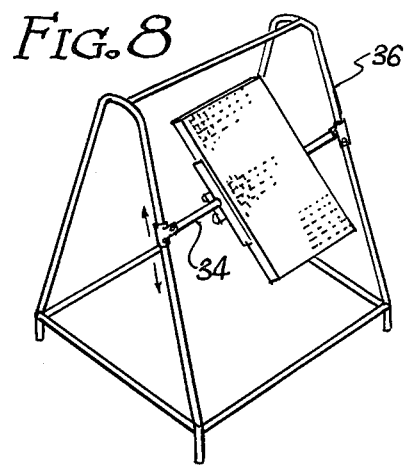
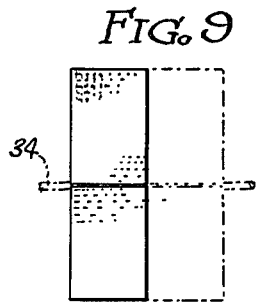
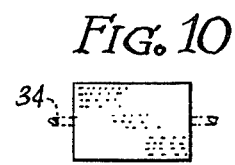
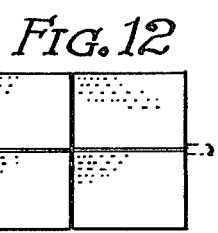
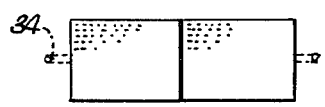
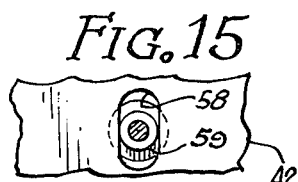
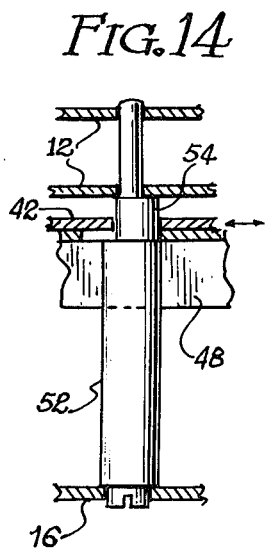
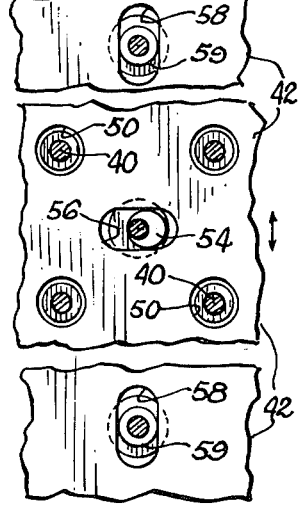

UNIVERSAL WIRING HARNESS FORMBOARD

BACKGROUND OF THE INVENTION

With the increasing complexity of electrical wiring systems in a myriad of applications, especially airplanes and in the aerospace field, existing wiring harness making technology is advancing. The instant inventor, for example, has developed a computerized system for entraining the various types of wires used in a wiring harness around the pins of the wiring board substantially without human imput. This is not the only system for automatically threading the wires of a harness that has been developed, or is currently being developed. Because of the enormous complexity of these harnesses and their component harnesses, the expense of their creation is forcing manufacturers, and government purchasers of the manufactured equipment, to search for cheaper ways of creating the harnesses. Harness creation is an ideal area for the development of computer application, utilizing robot equipment which can be computer driven to any pre-set combination of locations, so that harnesses can be made by the computer directed robot, with the program being changeable at will for the creation of a different harness.

Such a system is particularly ideal for applications in which only a limited number of harnesses of any one type may be required, such as in the aircraft industry. The flexibility inherent in computer-operated harness making equipment is obvious.

However, whereas the computer data necessary to drive such a machine would be a simple matter, the mechanical interfacing required for the precise engagement and threading of numerous wires of different sizes and strengths, with different terminals, is naturally expensive and is in the developmental stage.

The other part of the harness making operation is the formboard on which these machines, or manual operators, actually create the harnesses. Currently, it is common practice for the manufacturer to have a permanent pegboard with the pegs at the appropriate positions with information indicating what types of wires are required and what type of terminals are needed. These boards are bulky when the enormous number that are needed in many manufacturing operations is considered. There is a storage problem, a problem of loss, breakage, and wear on the board surface. As a natural companion to the programmable wire threading machines used to create the actual harness, there is a need for a universal formboard which can be adapted to form any harness.

SUMMARY OF THE INVENTION

The instant invention provides the above-stated universal formboard, which can be changed in just a few minutes from any style harness pattern to any other style harness pattern. It is of modular construction, with one module comprising a panel having a work surface with a grid of bores therethrough through which extend the pins forming the pattern for the harness. The pins have heads so that they can never be pulled completely through the panel, and a back wall spaced rearwardly of the panel limits the rearward motion of the pins so that they cannot fall out of the bores completely, but they can be retracted beneath the working surface of the panel.

When the module is turned upside down, the pins will fall through the bores in the panel to extend as harness making pins. Inasmuch as only selected pins are desired to extend from the working surface, a pattern sheet, of Mylar or similar durable material, is fastened to the front of the panel. This sheet has holes punched where the selected pins are to extend, so that when the board is turned upside down only the selected pins protrude. While in this position, a locking mechanism comprising a sliding panel just behind the pin heads as they occur when in the extended position, slides to prevent return of these selected pins when the board is righted.

The modules are mounted singly, in pairs, or four at a time, or even more, to a clamp that engages a horizontal bar on a rack, which permits the selection of modules to be rotated upside down at will, and subsequently returned to an angle selected by the harness maker to be the most comfortable and convenient.

BRIEF DESCRIPTION OF THE DRAWINGS

FIG. 8 is a perspective view of the rack showing the module thereon;

FIGS. 9-12 illustrate the various combinations of modules and their positioning on the horizontal bar;

FIG. 13 is a detail showing two adjacent modules mounted together;

FIG. 14 is a section through portions of the board illustrating the locking sheet drive eccentric in elevation; and FIG. 15 is a plan view of fragments of the locking sheet illustrating the guide pins and the eccentric drive.

DETAILED DESCRIPTION OF THE PREFERRED EMBODIMENT

Figure 1:
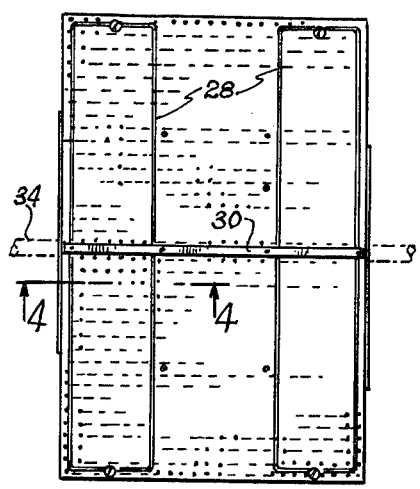
FIG. 1 is a plan view of the universal formboard.
Figure 4:
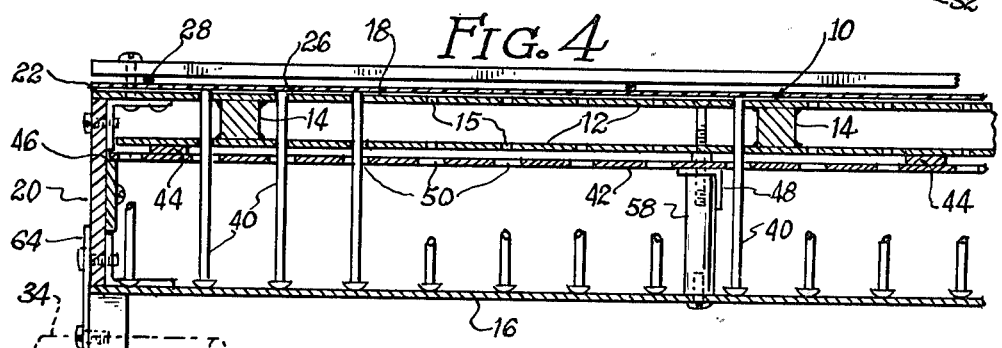
FIG. 4 is a section taken along line 4—4 of FIG. 1.

Overall construction of the formboard can thus be understood by reference to FIG. 4. The main panel is actually a sandwich 10 made of aluminum sheets 12 bonded to spacers 14 which extend the length of the board. The sheets 12 have holes 15 which align between the sheets to define the equivalent of a grid of bores best seen in FIG. 1, each bore defining a pin. Spaced to the rear of the front sheet of the panel 10 is a rear wall 16 which is spaced sufficiently to let the pins fall back on their heads clear of the work surface 18 of the panel. All of the pins shown in FIG. 4 are in the retracted mode, and are clear of the work surface. It should be noted that the rear wall is sufficiently close to the panel to prevent the pins from falling out of their bores. The panel 10 and the rear wall 16 are held together by frame structure 20, the details of which are not of importance to the invention as claimed.

Figure 2:
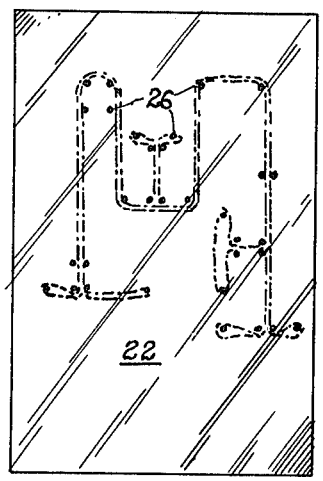
FIG. 2 is a plan view of a typical pattern sheet.
Figure 3:
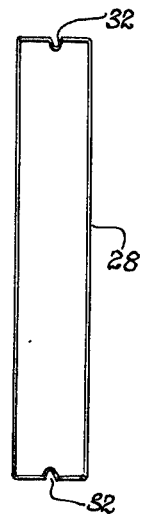
FIG. 3 illustrates the wire retainer which holds the pattern sheet in place on the formboard.

Applied across the work surface of the panel 10 is a pattern sheet 22, which is shown in isolation in FIG. 2. The pattern sheet is designed to accommodate a particular harness pattern as indicated in phantom at 24 in FIG. 2. The pattern sheet is solid except for a very few holes 26 which are punched through the pattern where the pins should be to make the selected harness.

The Mylar pattern sheet is held in place by two wire frames 28 which are in turn held against the Mylar by clamping bar 30 and by bolts which engage the detents 32 in either end of the frame. This hold down means is not necessarily exclusive, and could be replaced for example by vacuum hold down, magnetic sheet retention, or any other suitable system.

Figure 7:
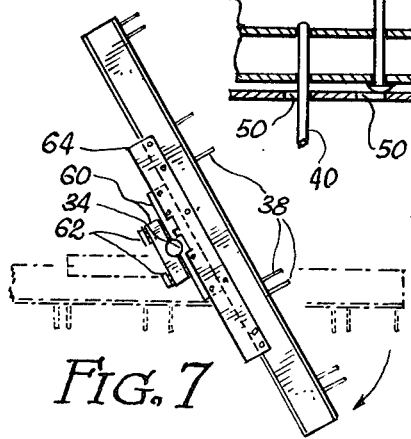
FIG. 7 illustrates the module of FIG. 1 as it appears mounted on its horizontal bar and rotating back into the harness making position.

When the pattern sheet is in place, the whole board is inverted on a horizontal bar 34 as shown in FIGS. 7 and 8. This bar is mounted on a rack or frame 36 and is preferably vertically adjustable as indicated in FIG. 8 so that it may be custom positioned by the operator.

Figure 5:
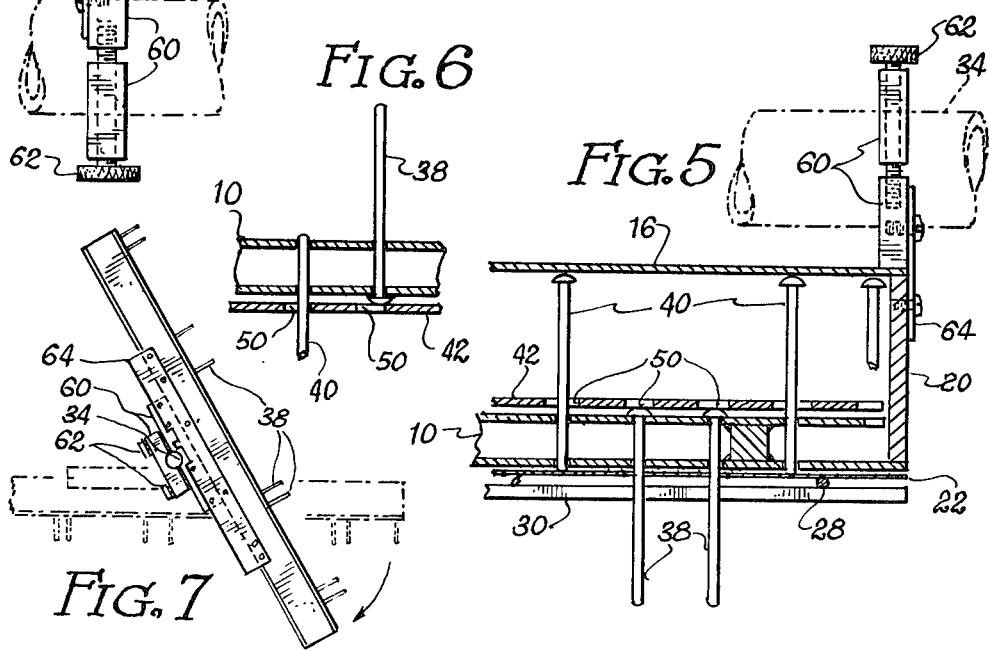
FIG. 5 is a typical section showing the horizontal bar in phantom.

When in the inverted position, as best shown in FIG. 5, the selected pins 38 which are permitted to pass through the holes 26 in the pattern sheet drop until their heads are stopped by the rear layer of the sandwich panel 10. The remaining pins 40 in FIG. 5 remain in the retracted position. It should be noted that although the extension of the pins into their erect position shown at 38 in FIG. 5 is accomplished by gravity through the inversion of the board in the preferred embodiment, any means of applying a releasible force to all of the pins, concommitantly or even consecutively sequentially, could be used. For example, a magnetic field could replace the gravitational field, either en masse or as individual cylinoid-like units at each pin station or, a mechanical actuation system, even hand drive, could be used.

Once in the inverted position with the selected pins extended, a means is needed to lock these pins in that position so that when the formboard is righted, the selected pins will not fall back into the retracted position. This is accomplished by the lock sheet 42 which is spaced behind the rear sheet of the panel 10 by spacers 44 and held in place by their engagement at the edges 46 and by L-beams 48 which span the unit. The locking sheet has holes 50 therein which align with the pin stations and are sized to permit the passage therethrough of the heads of the pins, which of course is necessary to achieve the configuration of the pins 38 in FIG. 5. Once in this position, however, a slight adjustment to one side to misalign this sheet with the pin stations results in the configuration of FIG. 6. Although the holes 50 may or may not lock the shafts of the pins 40 which are retracted (it probably does not matter), they do engage a portion of the pin head as shown in FIG. 6 to prevent its separation and return into the retracted position.

Although obviously there are a number of ways in which the movement of the lock plate can be accomplished, in the illustrated embodiment, best shown in FIG. 14, a rotating shaft 52 operated by a screw driver rotates the eccentric barrel 54 which rides in the slot 56 in the locking sheet, best shown in FIG. 15. Powered means remotely operated could also be used. Orthogonally oriented slots 58 guide the locking sheet on the guide pins 59, which are of construction similar to the eccentric shaft 52, but there is no eccentric. As the eccentric is rotated, it can be seen from FIG. 15 that, orientation taken from that figure, the locking sheet will move up and down, corresponding to movement from the position shown in FIG. 5 to that shown in FIG. 6.

Figure 6:
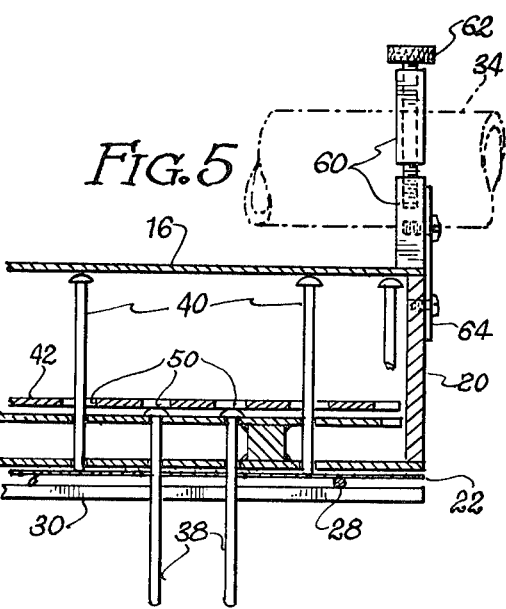
FIG. 6 is a detail illustrating the approximate relation of the lock sheet to extended and retracted forming pins.

After the locking sheet is locked, the board is righted, to the position shown in FIG. 6, as illustrated in FIG. 7. At this point the pattern sheet can be removed, if desired, or in some instances it may be desirable to leave it on the board, as necessary harness forming lines and notes may appear on the Mylar.

The units can be used singly as shown in FIG. 8, or, inasmuch as they are modular in nature, can be grouped in a number of ways as indicated in FIGS. 9–12. Like tiles, any side can be joined to any side of any other module. A pair of clamps 60 releasibly engage the bar 36 as shown in FIG. 4. Knobs 62 permit the release of pressure and rotation of the board. A bracket 64 connects the clamp to the sides of the modules as shown in FIG. 4. In the event two boards are used such that one is above the other, the bracket plate 64 spans the two. In case the panels are used alongside one another horizontally, a pair of brackets engages between the two as shown in FIG. 13. Construction is such that the spacing between adjacent pins is maintained the same across the gaps between two adjacent modules as shown in FIG. 13. In actual practice, this spacing has been set at one inch.

The formboard is truly universal, being adapted to any configuration wherein a planar work surface is required with periodic, spaced pegs for the actual entraining of the wire. The pattern sheets can be stored in a compact, easily cataloged manner, with new patterns being very simply made by special hole punch right on the working surface of the formboard. In current models, the board can be expanded from a single two-foot by three-foot module, to an array nine feet long and four feet tall. Because it is rotationally and vertically adjustable, harness makers do not have to conform to a pre-set height and orientation of formboard, but may adjust the board to their own liking. Although much discussion has involved a person as the actual harness maker, as stated above, the machine is equally adapted for use by automated harness makers, and provides a suitable complement to the programmable harness making machine.

While the preferred embodiment of the invention has been described, other modifications may be made thereto and other embodiments may be devised within the spirit of the invention and the scope of the appended claims.

What is claimed is:

1. A universal formboard for making harnesses comprising:
   (a) a frame defining a work surface and a plurality of spaced pin stations;
   (b) each of said stations having a pin movable between a retracted mode out of the way and an erect mode extended from said work surface;
   (c) a pattern positionable to physically block all of said pins and prevent same from moving from said retraction mode to said erect mode except for selected pins defining a pre-selected erect pin pattern;
   (d) means for applying a force against all of said pins to bias said pre-selected pins into the erect mode while said pins which are not pre-selected are blocked by said pattern; and,
   (e) locking means for securing said pre-selected pins in said erect mode after applying said force, so said force can be released and said selected pins remain in said pre-selected pattern extending from said work surface.

2. Structure according to claim 1 wherein said pins have mass and said means for applying force comprises inversion means for said frame to gravitationally bias said pre-selected pins into said erect mode.

3. Structure according to claim 1 wherein said frame has a panel defining said surface and including a back wall parallel to said panel and on the opposite side from said working surface, and said pin stations comprise bores through said panel for the extension therethrough of said pins when in the erect mode, said pins have a head to prevent them from extending completely through said panel in the erect mode, said back wall being spaced from said panel to define a pin chamber but sufficiently close thereto to prevent complete exit of said pins from said bores when said pins fall full back against said back wall.

4. Structure according to claim 3 and including a rack having means to suspend said frame on a horizontal axis to permit said frame to be rotated until the working surface faces down, and said means for applying said force is gravity causing said pins to fall through said bores until the pin heads engage the rear surface of said panel.

5. Structure according to claim 4 wherein said locking means comprises a rigid pin head stop sheet spaced to the rear of said panel and parallel thereto and having clearance holes slightly larger than the pin heads and aligned with each respective pin station and being translatable to offset said clearance holes from their aligned positions to block retreat of said selected pins into said pin cavity.

6. Structure according to claim 1 wherein said pattern comprises a sheet with pre-punched holes establishing said pre-selected erect pin pattern and including means to fasten same to said work surface to align said pre-punched holes with said selected pins.

7. Structure according to claim 4 wherein a bar defines said axis, said bar is adjustable in elevation and said means to suspend said frame comprises clamps engageable on said frame and releasibly clampable on said bar to permit the establishment of said selectable rotatably adjusted positions.

8. Structure according to claim 7 wherein said clamps are engageable concomitantly on a plurality of said universal form boards in a substantially coplanar contiguous array and said frame is sufficiently large to suspend such an array, such that a modular system is provided.

9. A method of creating a harness making formboard comprising the following steps:
(a) taking a panel having a work surface and a plurality of spaced pin stations with a pin for each station and each pin having a retracted mode and an extended erect mode and beginning in the retract mode, and so positioning a pattern element relative to said pins to block the movement of all said pins into said erect mode except selected pins to define a pre-selected erect pin pattern; and
(b) applying a force against all of said pins biasing same into the erect mode such that all pins are blocked by said pattern except the selected pins, whereby the latter form into said pre-selected erect pin pattern.

10. A method according to claim 9 and including the further following step:
(c) locking said selected pins in the erect mode.

11. A method according to claim 10 wherein step (b) comprises turning said panel with the work surface down whereby said pins fall into the erect mode under gravity, and including step (d) of righting said panel.

12. A method according to claim 11 wherein said panel is provided with spaced bores to define said pin stations, and said pins have heads to stop against said panel when in the erect mode, and step (c) comprises slipping the pin head stop sheet in back of the heads of said selected pins.

13. A method according to claim 12 wherein said pattern element comprises a pattern sheet with pre-punched holes to align with the bores in said panel which define pin stations of selected pins, and step (a) comprises fastening said pattern element over said work surface.

14. A method according to claim 13 and comprising the further step of removing said pattern element subsequent to step (c).

15. A method according to claim 10 and including a frame defining a horizontal bar and step (b) comprises substeps of (1) lockably journalling said panel on said bar, and (2) rotating said panel into the upside-down position on said bar.

16. A method according to claim 15 and including the step prior to step (b) of grouping a plurality of panels in a substantially co-planar contiguous array to define a modular system.

17. A method according to claim 10 wherein said pattern defines holes at the pre-selected pin positions, said force is substantially evenly applied against all of said pins, said force being being adequate to push said pre-selected pins through said holes in said pattern, but being insufficient to push pins other than pre-selected pins through said pattern itself.

18. Method according to claim 17 wherein said force is applied against all of said pins substantially simultaneously.

19. Structure according to claim 1 wherein said means for applying force applies force substantially uniformly and simultaneously to all of said pins.

* * * * *